(12) United States Patent
Lin

(10) Patent No.: US 12,407,353 B1
(45) Date of Patent: Sep. 2, 2025

(54) PHASE LOCK LOOP HAVING LOW CLOCK JITTERS

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 18 days.

(21) Appl. No.: 18/667,405

(22) Filed: May 17, 2024

(51) Int. Cl.
*H03L 7/093* (2006.01)

(52) U.S. Cl.
CPC .................................. *H03L 7/093* (2013.01)

(58) Field of Classification Search
CPC ....................................................... H03L 7/093
See application file for complete search history.

(56) References Cited

U.S. PATENT DOCUMENTS

| | | | |
|---|---|---|---|
| 10,312,921 B1* | 6/2019 | Cheng | H03L 7/099 |
| 10,998,892 B1 | 5/2021 | Lin | |
| 12,283,965 B1* | 4/2025 | Lin | H03L 7/0891 |
| 2015/0341041 A1* | 11/2015 | Balachandran | H03L 7/085 327/156 |
| 2023/0006683 A1* | 1/2023 | J | H03L 7/0992 |

* cited by examiner

*Primary Examiner* — Patrick O'Neill
(74) *Attorney, Agent, or Firm* — McClure, Qualey & Rodack, LLP

(57) ABSTRACT

A phase lock loop includes a clock multiplier configured to receive a reference clock and output a multiplied clock; a phase detector configured to receive the multiplied clock and a divided clock and output a phase error signal; a loop filter configured to receive the phase error signal and output a control signal; a controllable oscillator configured to output an output clock in accordance with the control signal; and a clock divider configured to receive the output clock and output the divided clock, wherein the clock multiplier is either a frequency doubler or a frequency quadrupler, and a frequency response of the loop filter comprises a first notch at the frequency of the reference clock and a second notch at twice the frequency of the reference clock.

12 Claims, 4 Drawing Sheets

PHASE LOCK LOOP HAVING LOW CLOCK JITTERS

BACKGROUND OF THE INVENTION

Field of the Invention

The present invention generally relates to phase lock loops and particularly to phase lock loops having low clock jitters.

Description of Related Art

As shown in FIG. 1, a PLL (phase lock loop) 100 comprises a PFD (phase/frequency detector) 110, a CP (charge pump) 120, a LP (loop filter) 130, a VCO (voltage-controlled oscillator) 140, and a MMD (multi-modulus divider) 150. The PFD 110 detects a timing (which is a time at which a rising edge occurs) difference between a reference clock and a divided clock and outputs two logical signals UP (which stands for "up") and DN (which stand for "down") to represent the timing difference. Each time a detection is made by the PFD 110, a pulse of UP is generated if the reference clock is ahead of the divided clock in the timing, and a pulse of DN is generated if the divided clock is ahead of the reference clock in the timing, wherein a width of the pulse of UP or the pulse of DN is proportional to the timing difference that is detected. The CP 120 receives UP and DN and outputs an error current to represent the timing difference, such that the error current is of positive polarity if the reference clock is ahead of the divided clock in the timing, and of negative polarity if the divided clock is ahead of the reference clock in the timing, and a net charge of the error current, which is an integral of the error current, is proportional to the timing difference. The LP 130 receives the error current and establishes a control voltage that controls the VCO 140, which outputs a VCO clock. The MMD 150 receives the VCO clock and output the divided clock in accordance with a divisor value N, such that one pulse of the divided clock is generated for every N pulses of the VCO clock. A closed-loop control system is thus established to adjust the frequency/phase of the VCO clock to lock to the frequency/phase of the reference clock, and the frequency of the VCO clock will be N times higher than the frequency of the reference clock. PLL 100 is a well-known prior art and thus not further described in detail here.

In PLL 100, it is usually highly desirable that the VCO clock is clean and has low phase noises and thus low timing jitters. Note that "phase noises" and "timing jitters" are the same thing in essence, and both characterize the impurity of the VCO clock: phase noises characterize it in frequency domain, while timing jitters characterize it in time domain. In practice, however, all of the building blocks of PLL 100, i.e., PFD 110, CP 120, LF 130, VCO 140, and MMD 150, contribute circuit noises that lead to phase noises and timing jitters of the VCO clock. The circuit noises in PFD 110, CP 120, LF 130, and MMD 150 will contribute to the phase noises of the VCO clock in accordance with transfer characteristics that have a low-pass frequency response with a gain equal to the divisor value N, while the circuit noises of VCO 140 will contribute to the phase noises of the VCO clock in accordance with transfer characteristics that have a high-pass frequency response; these are well understood by those of ordinary skill in the art and thus not explained in detail.

In addition, the phase noises of the reference clock will also contribute to phase noises of the VCO clock in accordance with transfer characteristics that have a low-pass frequency response with a gain equal to the divisor value N. Therefore, it is highly desirable that the reference clock is clean and has low phase noises. In practice, the reference clock is usually generated by a crystal oscillator that can output a clean clock of low phase noises. Even so, the VCO clock is subject to having a deterministic periodic timing jitter of a frequency equal to the frequency of the reference clock and in spectral domain is referred to as the "reference spur." In a case where the frequency of the reference clock is 40 MHz, the divisor value N is 240, and the frequency of the VCO clock is 9600 MHz, for instance, the VCO clock will have a deterministic timing jitter of the frequency 40 MHz. This is because PFD 110 performs phase detection periodically, once for every 25 ns (which is the period of the reference clock), and thus the PLL 100 is disturbed once for every 25 ns, causing the VCO clock to be disturbed once for every 25 ns and thus having a periodic timing jitter of 25 ns in period, or 40 MHz in frequency.

What is desired is a phase lock loop that can reduce phase noises and timing jitters of the VCO clock by reducing the contributions from the periodic disturbance of the reference clock and the circuit noises of building blocks from within the phase lock loop.

BRIEF SUMMARY OF THIS INVENTION

An objective of embodiments of the invention is to reduce phase noises and timing jitters of an output clock of a phase lock loop.

An objective of embodiments of the invention is to mitigate the timing jitters of an output clock of a phase lock loop due to a periodic disturbance of a reference clock.

An objective of embodiments of the invention is to mitigate degradation of phase noises of an output clock of a phase lock loop due to the circuit noises of building blocks within the phase lock loop.

In an embodiment, a phase lock loop comprises: a clock multiplier configured to receive a reference clock and output a multiplied clock; a phase detector configured to receive the multiplied clock and a divided clock and output a phase error signal; a loop filter configured to receive the phase error signal and output a control signal; a controllable oscillator configured to output an output clock in accordance with the control signal; and a clock divider configured to receive the output clock and output the divided clock in accordance with a divisor value, wherein the clock multiplier is either a frequency doubler or a frequency quadrupler, and a frequency response of the loop filter comprises a first notch at the frequency of the reference clock and a second notch at twice the frequency of the reference clock.

DETAILED DESCRIPTION OF THIS INVENTION

Figure 1:
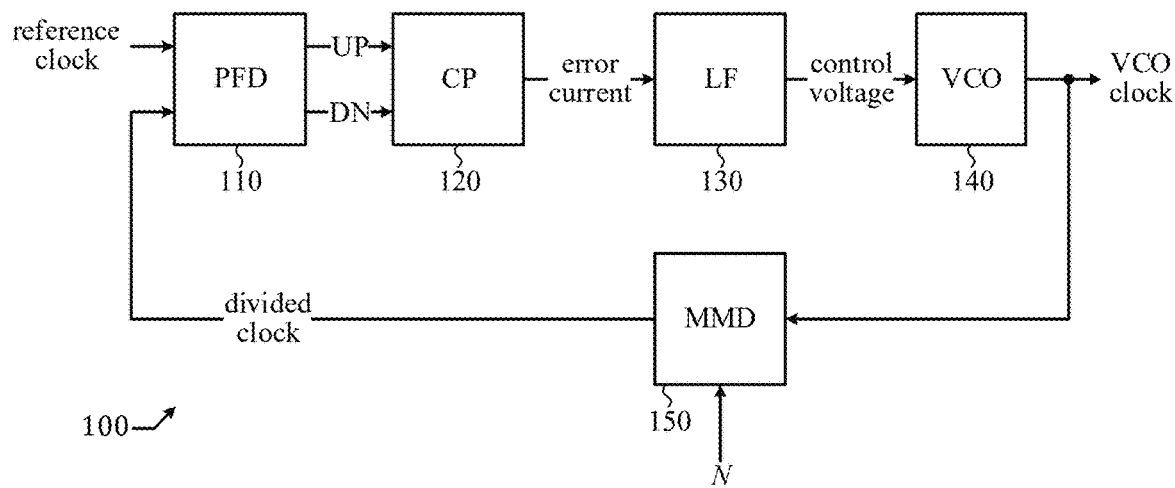
FIG. 1 shows a functional block diagram of a PLL (phase lock loop).

The present invention relates to phase lock loop. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in the context of this disclosure, such as "voltage," "current," "signal," "logical signal," "ground," "clock," "clock jitters," "frequency," "period," "phase," "(clock) edge," "capacitor," "resistor," "inverter," "XOR (exclusive-OR) gate," "low-pass filter," "oscillator," "phase noise," and "timing jitter." Terms and basic concepts like these in the context of this present disclosure are apparent to those of ordinary skill in the art and thus will not be explained in detail.

Those of ordinary skill in the art can recognize symbols of commonly used circuit elements such as resistor, capacitor, inverter, and logic gates, and also recognize the ground symbol, and therefore can read a schematic diagram and understand interconnections between circuit elements therein without the need of detailed descriptions.

A circuit is a collection of a transistor, a capacitor, an inductor, a resistor, and/or other electronic devices interconnected in a certain manner to embody a certain function. A network is a circuit or a collection of circuits configured to embody a certain function.

In this present disclosure, a "circuit node" is simply referred to as a "node" for short, as the meaning is clear from a context of microelectronics and won't cause confusion.

In this present disclosure, a signal is either a voltage or a current of a variable level that can vary with time. A (voltage or current, whichever applicable) level of a signal at a moment represents the state of the signal at that moment.

A logical signal is a signal of two states: a low state and a high state. The low state is also referred to as a "0" state, while the high stage is also referred to as a "1" state. Regarding a logical signal Q, "Q is high" or "Q is low," means that "Q is in the high state" or "Q is in the low state." Likewise, "Q is 1" or "Q is 0," means that "Q is in the 1 state" or "Q is in the 0 state."

When a logical signal toggles from low to high, it undergoes a low-to-high transition and a rising edge occurs. When a logical signal toggles from high to low, it undergoes a high-to-low transition and a falling edge occurs. A pulse of a logical signal starts at a rising edge and ends at a subsequent falling edge.

A first logical signal is said to be a logical inversion of a second logical signal if the first logical signal and the second logical signal are always in opposite states. That is, when the first logical signal is 0 (low), the second logical signal is 1 (high); when the first logical signal is 1 (high), the second logical signal is 0 (high). When a first logical signal is a logical inversion of a second logical signal, the first logical signal and the second logical signal are said to be complementary to one another.

A clock is a logical signal that cyclically toggles back and forth between a low state and a high state. The period of the clock is the time difference between the present rising edge (low-to-high transition) and the next rising edge. The frequency of the clock is the reciprocal of the period. A clock is essentially a pulse train comprising many pulses that are concatenated sequentially. The duty cycle of a clock is the ratio between the pulse width and the period of the clock.

Figure 2:
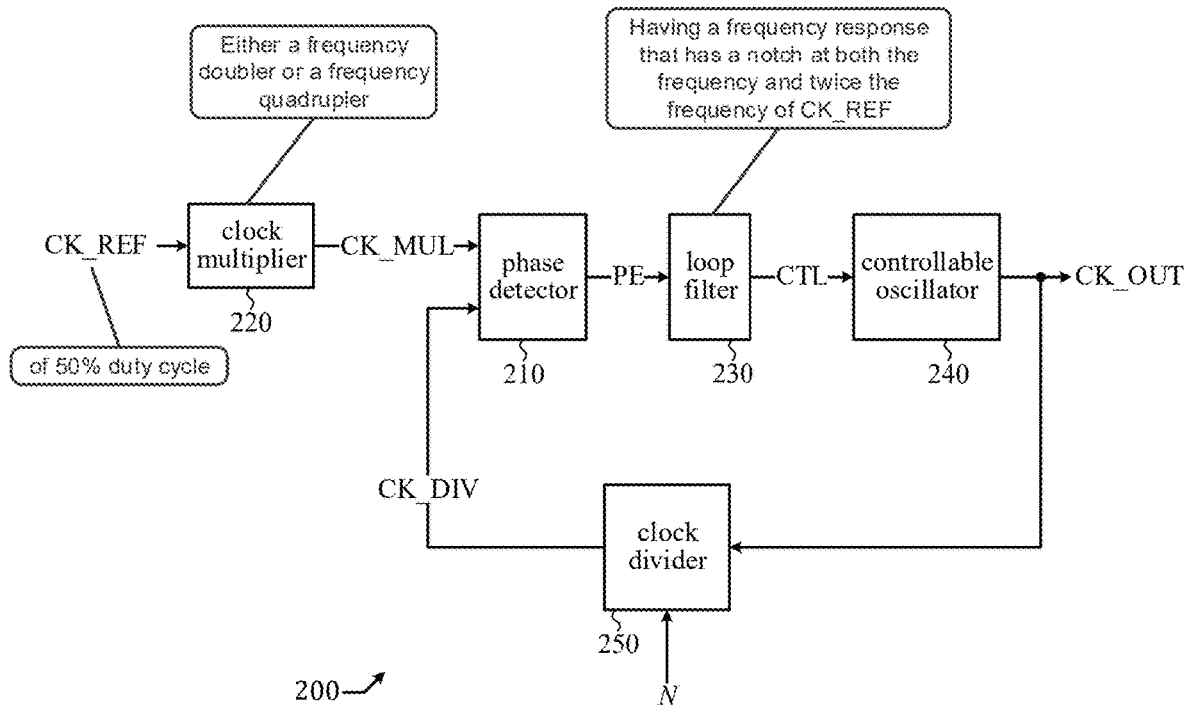
FIG. 2 shows a functional block diagram of a PLL in accordance with an embodiment of the present disclosure.

A functional block diagram of a PLL (phase lock loop) 200 in accordance with an embodiment of the present disclosure is shown in FIG. 2. PLL 200 comprises: a clock multiplier 220 configured to receive a reference clock CK_REF and output a multiplied clock CK_MUL; a phase detector 210 configured to receive the multiplied clock CK_MUL and a divided clock CK_DIV and output a phase error signal PE that represents a time difference between the multiplied clock CK_MUL and the divided clock CK_DIV; a loop filter 230 configured to receive the phase error signal PE and output a control signal CTL; a controllable oscillator 240 configured to output an output clock CK_OUT in accordance with the control signal CTL; and a clock divider 250 configured to receive the output clock CK_OUT and output the divided clock CK_DIV in accordance with a divisor value N. Let the frequency of the reference clock CK_REF be $f_{REF}$. Clock multiplier 220 performs clock frequency multiplication by a factor of either two or four; in other words, the frequency of CK_MUL is either $2f_{REF}$ or $4f_{REF}$. The frequency response of the loop filter 230 is null at $f_{REF}$ (the frequency of CK_REF) and also at $2f_{REF}$ (twice the frequency of CK_REF).

Phase detector 210 performs a phase detection function, such that PE is proportional to a time difference between CK_MUL and CK_DIV. In an embodiment, phase detector 210 comprises a PFD (phase/frequency detector) followed by a charge pump (just like PFD 110 and CP 120 in FIG. 1), and PE is a current (just like the error current in FIG. 1). Both PFD and charge pump are well known in the prior art and thus not further explained. Controllable oscillator 240 outputs CK_OUT such that the frequency of CK_OUT will be approximately a linear function of CTL. In an embodiment, CTL is a voltage, and controllable oscillator 240 is a voltage-controlled oscillator (just like VCO 140 in FIG. 1), which is well known in the prior art and thus not further explained. Clock divider 250 performs a clock division (i.e., divided-by-N) function, such that one pulse of CK_DIV is generated for every N pulses of CK_OUT and therefore the frequency of CK_DIV is lower than the frequency of CK_OUT by a factor of N. In an embodiment, clock divider 250 is a multi-modulus divider (just like MMD 150 in FIG. 1).

Phase detector 210, loop filter 230, controllable oscillator 240, and clock divider 250 form a feedback loop to force the timing of CK_OUT to lock to the timing of CK_MUL. If the clock multiplier 220 is removed and CK_REF is directly shorted to CK_MUL, PLL 200 would be functionally the same as PLL 100 of FIG. 1 (wherein PFD 110 and CP 120 are an embodiment of phase detector 210, VCO 140 is an embodiment of controllable oscillator 240, and MMD 150 is an embodiment of clock divider 250), and likewise the circuit noises of phase detector 210, loop filter 230, and clock divider 250 will contribute to the phase noises of the output clock CK_OUT in accordance with transfer characteristics that have a low-pass frequency response with a gain equal to the divisor value N. However, in PLL 200, the output clock CK_OUT does not directly lock to the reference clock CK_REF, but instead lock to the multiplied clock CK_MUL, which is either two times or four times higher in frequency than the reference clock CK_REF. Given the same frequency of CK_REF and the same frequency of CK_OUT, inserting the clock multiplier 220 between the reference clock CK_REF and the phase detector 210 allows the divisor value N to be reduced by a factor of either two or four, compared to the case wherein the clock multiplier 220 is removed and CK_REF is directly shorted to CK_MUL. Since the circuit noises of phase detector 210, loop filter 230, and clock divider 250 will contribute to the phase noises of the output clock CK_OUT in accordance with transfer characteristics that have a low-pass frequency response with a gain equal to the divisor value N, reducing the divisor value N by a factor of either two or four can lead to lower phase noise of the output clock CK_OUT. The objective of reducing phase noises and clock jitters of the output clock CK_OUT thus can be fulfilled.

Figure 3A:
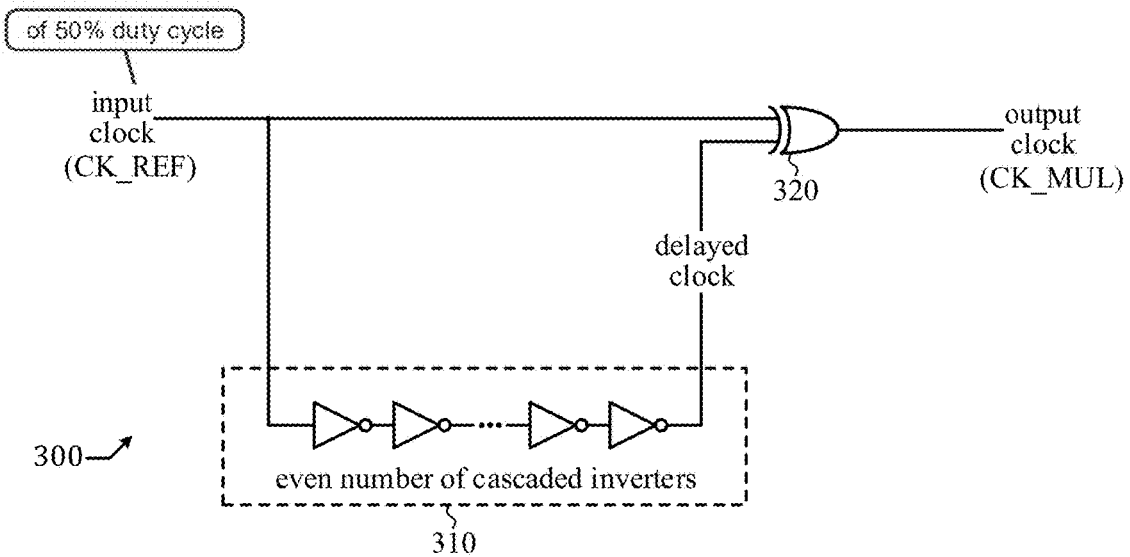
FIG. 3A shows a schematic diagram of a frequency doubler.
Figure 3B:
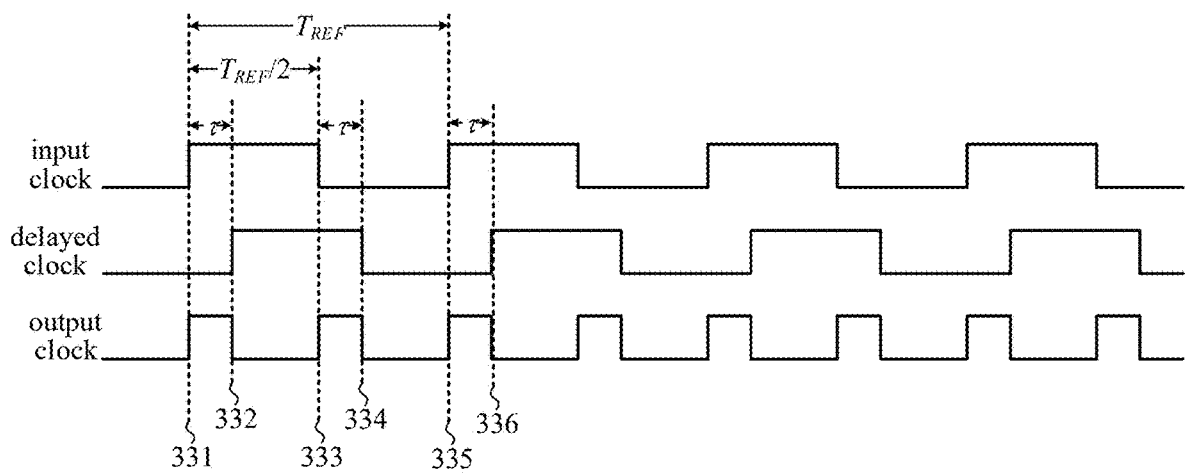
FIG. 3B shows a timing diagram of the frequency doubler of FIG. 3A.

In a frequency doubling embodiment, the clock multiplier 220 is a frequency doubler. A schematic diagram of a frequency doubler 300 that can be used to embody the clock multiplier 220 in FIG. 2 is depicted in FIG. 3A. Frequency doubler 300 comprises a clock delay circuit 310 comprising an even number of inverters configured in a cascade topology to receive an input clock and output a delayed clock, and an XOR (exclusive OR) gate 320 configured to receive the input clock and the delayed clock and output an output clock. A timing diagram of the frequency doubler 300 is shown in FIG. 3B. The input clock has a rising edge at time 331 and time 335 and has a falling edge at time 333. The difference between time 331 and time 335 is $T_{REF}$, which is the clock period of the input clock and equal to $1/f_{REF}$. The time difference between the rising edge at time 331 and the falling edge at time 333 is a pulse width of the input clock and equal to $T_{REF}/2$; this is based on assuming the duty cycle of the input clock is 50%. As shown, the delayed clock is the same as the input clock except for a time delay of amount t that depends on the number of inverters cascaded in the clock delay circuit 310. To be specific, the delayed clock has a rising edge at time 332 and time 336 and has a falling edge at time 334, and the difference between the rising edge of the input clock at time 331 (335) and the rising edge of the delayed clock at time 332 (336) is t. Likewise, the difference between the falling edge of the input clock at time 333 and the falling edge of the delayed clock at time 334 is also t. The output clock is high when both the input clock and the delayed clock are high, and the output clock has a rising edge upon either a rising edge or a falling edge of the input clock. As a result, the output clock has a rising edge at time 331, time 333, and time 335, and has a falling edge at time 332, time 334, and time 336. Of the output clock, the difference between the rising edge at time 331 and the rising edge at time 333 is $T_{REF}/2$, which is the period of the output clock. Therefore, the frequency of the output clock is $2f_{REF}$, since $T_{REF}=1/f_{REF}$. Here, "input clock" and "output clock" are generic names. When using the frequency doubler 300 to embody the clock multiplier 220, the input clock means CK_REF and the output clock means CK_MUL. If the duty cycle of the input clock is not 50%, the difference between time 331 and time 333 will not be $T_{REF}/2$; of the output clock, an odd cycle (e.g. the cycle between time 331 and time 333) will have a different time duration from an even cycle (e.g., the cycle between time 333 and time 335). This causes the output clock to have a deterministic jitter of a frequency equal to $f_{REF}$, which is the frequency of the input clock.

In a frequency quadrupling embodiment, the clock multiplier 220 is a frequency quadrupler. A functional block diagram of a frequency quadrupler 400 that can be used to embody the clock multiplier 220 is shown in FIG. 400. The frequency quadrupler 400 comprises a first frequency doubler 410 configured to receive an input clock and output an intermediate clock, and a second frequency doubler 420 configured to receive the intermediate clock and output an output clock. Here, "input clock," "output clock," and "intermediate clock" are generic names. When using the clock quadrupler 400 to embody the clock multiplier 220 of FIG. 2, the input clock means CK_REF and the output clock means CK_MUL. The input clock needs to have 50% duty cycle. The first frequency doubler 410 is a special type of frequency doubler that can control the duty cycle of the intermediate clock to 50%. In an embodiment, the first frequency doubler 410 is based on using the frequency doubler circuit disclosed in U.S. Pat. No. 10,998,892 that can control the due cycle of the intermediate clock to 50%. If the duty cycle of the input clock is not 50%, the intermediate clock will have a deterministic jitter of a frequency equal to $f_{REF}$ (i.e., the frequency of the input clock). The second frequency doubler 420 can be embodied by instantiating the frequency doubler 300 of FIG. 3A. If the duty cycle of the intermediate clock is not 50%, the output clock will have a deterministic jitter of a frequency equivalent to the frequency of the intermediate clock, which is $2f_{REF}$ (i.e., twice the frequency of the input clock).

In both the frequency doubling embodiment and the frequency quadrupling embodiment, CK_REF needs to be of 50% duty cycle. If the duty cycle of CK_REF is not perfectly 50%, CK_MUL will contain a deterministic jitter of a frequency equal to $f_{REF}$. If the frequency doubling embodiment is adopted, CK_OUT will also have a reference spur of a frequency equal to the frequency of CK_MUL, which is $2f_{REF}$. If the frequency quadrupling embodiment is adopted and the duty cycle of the intermediate clock therein is not 50%, CK_MUL will have a deterministic jitter of a frequency equal to $2f_{REF}$, causing CK_OUT to have a deterministic jitter of a frequency equal to $2f_{REF}$. In either case, in practice, CK_OUT will likely contain a deterministic jitter with spectral components at both $f_{REF}$ and $2f_{REF}$. To alleviate the deterministic jitters, loop filter 230 has a frequency response that is null at both $f_{REF}$ and $2f_{REF}$.

In this present disclosure, a notch filter refers to a filter of which the frequency response is null at a certain frequency referred to as the notch frequency.

Figure 5:
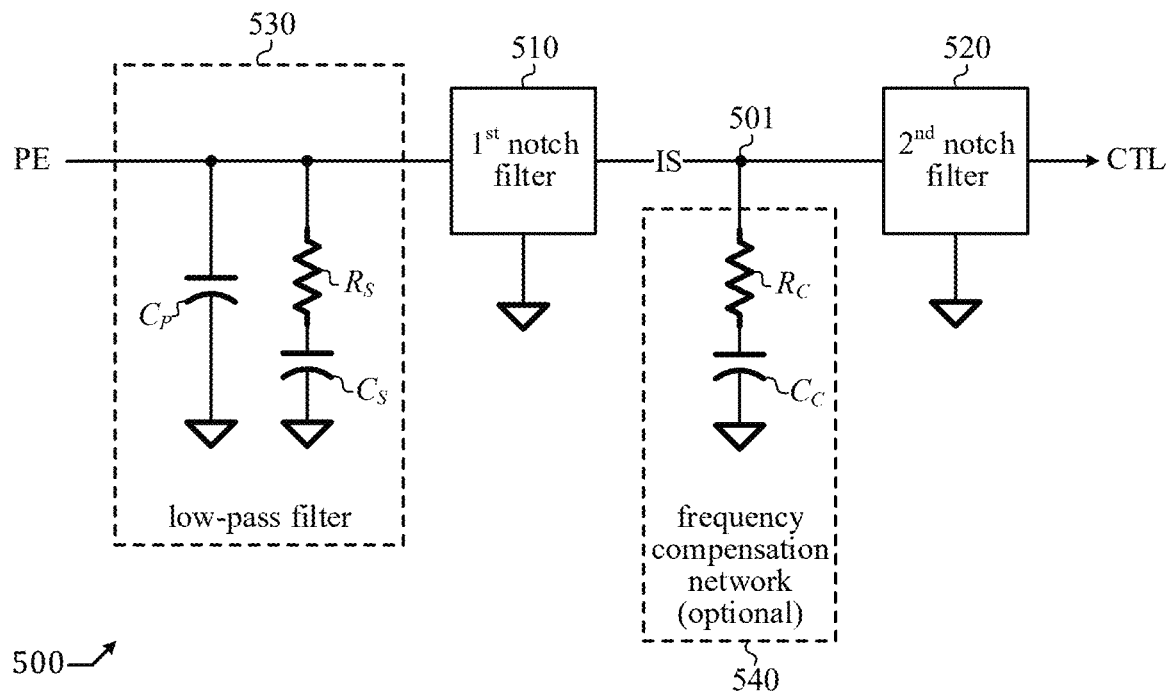
FIG. 5 shows a schematic diagram of a loop filter that can be used for the PLL of FIG. 2.

A schematic diagram of a loop filter 500 that can be used to embody loop filter 230 is shown in FIG. 5. The loop filter 500 comprises: a low-pass filter 530 configured to be a load to the phase error signal PE, a $1^{st}$ notch filter 510 configured to receive the phase error signal PE and output an intermediate signal IS, and a $2^{nd}$ notch filter configured to receive the intermediate signal IS and output the control signal CTL. The low-pass filter 530 comprises a parallel connection of a parallel capacitor $C_P$ and a resistor-capacitor network comprising a serial connection of a serial resistor $R_S$ and a serial capacitor $C_S$. The low-pass filter 530 is frequently used in a typical type-2 phase lock loop that is well understood by those of ordinary skill in the art and thus not further explained in detail here.

Figure 6:
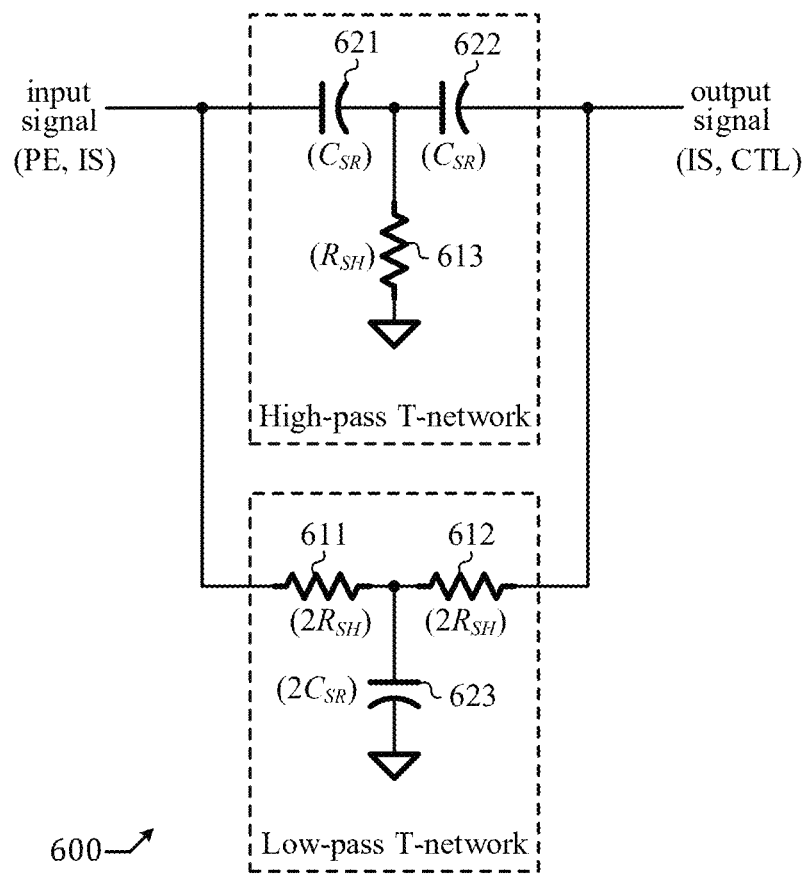
FIG. 6 shows a schematic diagram of a twin-T notch filter that can be instantiated and used in the loop filter of FIG. 5.

Both the $1^{st}$ notch filter 510 and the $2^{nd}$ notch filter 520 can be embodied by instantiating a twin-T notch filter 600 shown in FIG. 6. The twin-T notch filter 600 comprises a parallel combination of a low-pass T-network and a high-pass T-network. The low-pass T-network comprises two serial resistors 611 and 612 and a shunt capacitor 623. The high-pass T-network comprises two serial capacitors 621 and 622 and a shunt resistor 613. The two serial capacitors 621 and 622 are of the same capacitance $C_{SR}$. The shunt resistor 613 is of resistance $R_{SH}$. The two serial resistors 611 and 612 are of the same resistance $2R_{SH}$. The shunt capacitor 623 is of capacitance $2C_{SR}$. Here, "input signal" and "out signal" are generic names. When the twin-T notch filter 600 is instantiated to embody the $1^{st}$ notch filter 510, the input signal means PE and the output signal means IS; and when the twin-T notch filter 600 is instantiated to embody the $2^{nd}$ notch filter 520, the input signal means IS and the output signal means CTL. The transfer function from the input signal to the output signal is null at a notch frequency $f_{notch}$ determined by $C_{SR}$ and $R_{SH}$ in accordance with the following equation:

$$f_{notch} = \frac{1}{4\pi R_{SH} C_{SR}} \quad (1)$$

When the twin-T notch filter 600 is instantiated to embody a notch filter that has a notch at $f_{REF}$, the values of $C_{SR}$ and $R_{SH}$ are chosen in accordance with equation (1) such that $f_{notch}$ is equal to $f_{REF}$. When the twin-T notch filter 600 is instantiated to embody a notch filter that has a notch at $2f_{REF}$, the values of $C_{SR}$ and $R_{SH}$ are chosen in accordance with equation (1) such that $f_{notch}$ is equal to $2f_{REF}$.

Figure 4:
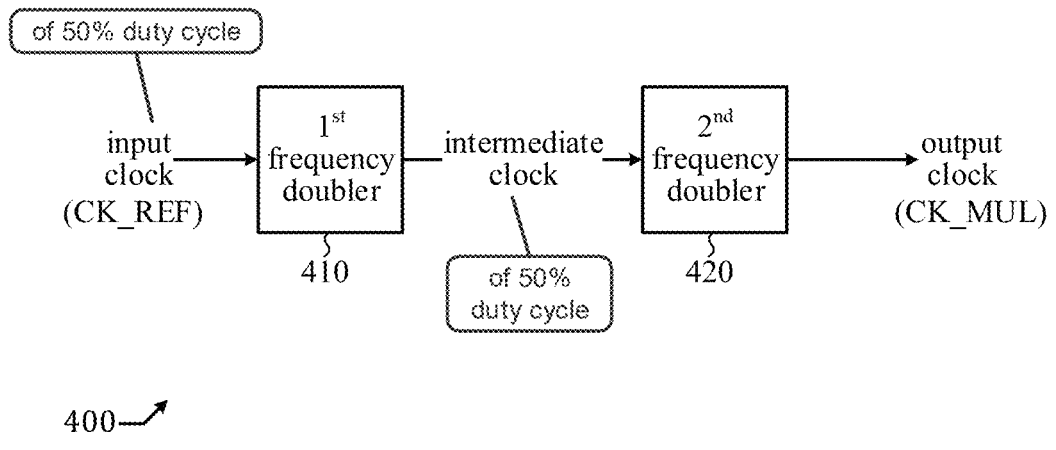
FIG. 4 shows a functional block diagram of a frequency quadrupler.

In an embodiment, the notch frequency of the 1st notch filter 510 is $f_{REF}$, while the notch frequency of the 2nd notch filter 520 is $2f_{REF}$. In another embodiment, the notch frequency of the 1st notch filter 510 is $2f_{REF}$, while the notch frequency of the 2nd notch filter 520 is $f_{REF}$. In either embodiment, spectral components at $f_{REF}$ and $2f_{REF}$ can be effectively suppressed by the loop filter 500. A deterministic jitter resulting from either CK_REF or the intermediate clock in the quadrupler 400 of FIG. 4 due to not having 50% duty cycle can be effectively suppressed. A reference spur of PLL 200 when using the frequency doubling scheme (by instantiating the frequency doubler 300 to embody the clock multiplier 220) can also be effectively suppressed.

Now refer to FIG. 2. By inserting the clock multiplier 220 between CK_REF and the phase detector 210, the divisor ratio N can be reduced and the phase noises of CK_OUT can be lowered, while the undesirable deterministic jitters in CK_OUT can be effectively suppress thanks to the loop filter 230 having a notch response at both $f_{REF}$ and $2f_{REF}$. This way, the objective of generating an output clock of lower phase noises and lower clock jitters can be fulfilled.

Now refer to FIG. 5. In an optional embodiment, loop filter 500 further includes a frequency compensation network 540 that is a shunt network inserted at the interconnection node 501 between the $1^{st}$ notch filter 510 and the $2^{nd}$ notch filter 520 and comprises a serial connection of a compensation resistor $R_C$ and a compensation capacitor Cc. The purpose of the frequency compensation network 540 is to improve stability of the control loop of PLL 200 by causing a phase advance of the intermediate signal IS.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A PLL (phase lock loop) comprising:
a clock multiplier configured to receive a reference clock and output a multiplied clock;
a phase detector configured to receive the multiplied clock and a divided clock and output a phase error signal;
a loop filter configured to receive the phase error signal and output a control signal;
a controllable oscillator configured to output an output clock in accordance with the control signal; and
a clock divider configured to receive the output clock and output the divided clock in accordance with a divisor value, wherein the clock multiplier is either a frequency doubler or a frequency quadrupler, and a frequency response of the loop filter comprises a first notch at a frequency of the reference clock and a second notch at twice the frequency of the reference clock.

2. The PLL of claim 1, wherein the clock multiplier is the frequency doubler comprising a clock delay circuit configured to receive the reference clock and output a delayed clock, and an exclusive-OR (XOR) gate configured to receive the reference clock and the delayed clock and output the multiplied clock.

3. The PLL of claim 2, wherein the clock delay circuit comprises an even number of inverters configured in a cascade topology.

4. The PLL of claim 1, wherein the clock multiplier is the frequency quadrupler comprising a first frequency doubler configured to receive the reference clock and output an intermediate clock and a second frequency doubler configured to receive the intermediate clock and output the multiplied clock, wherein the intermediate clock is of 50% duty cycle.

5. The PLL of claim 1, wherein the loop filter comprises a low-pass filter configured to be a load of the phase error signal, a first notch filter of a frequency response having a null at a first notch frequency and configured to receive the phase error signal and output an intermediate signal, and a second notch filter of a frequency response having a null at a second notch frequency and configured to receive the intermediate signal and output the control signal.

6. The PLL of claim 5, wherein the first notch frequency is equal to the frequency of the reference clock and the second notch frequency is equal to twice the frequency of the reference clock.

7. The PLL of claim 5, wherein the first notch frequency is equal to twice the frequency of the reference clock and the second notch frequency is equal to the frequency of the reference clock.

8. The PLL of claim 5, wherein the first notch filter is a twin-T notch filter.

9. The PLL of claim 5, wherein the second notch filter is a twin-T notch filter.

10. The PLL of claim 5, wherein the loop filter further includes a frequency compensation network configured to improve stability of the PLL of claim 5.

11. The PLL of claim 10, wherein the frequency compensation network is a shunt network connected to an interconnection node between the first notch filter and the second notch filter and comprising a serial connection of a compensation resistor and a compensation capacitor.

12. The PLL of claim 5, wherein the low-pass filter comprises a parallel connection of a parallel capacitor and a resistor-capacitor network comprising a serial connection of a serial resistor and a serial capacitor.

* * * * *